United States Patent
Clark et al.

(10) Patent No.: US 8,039,737 B2
(45) Date of Patent: *Oct. 18, 2011

(54) PASSIVE RARE EARTH TANDEM SOLAR CELL

(75) Inventors: Andrew Clark, Palo Alto, CA (US); Robin Smith, Palo Alto, CA (US); Richard Sewell, Palo Alto, CA (US); Scott Semans, Palo Alto, CA (US); F. Erdem Arkun, Palo Alto, CA (US); Michael Lebby, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/619,549

(22) Filed: Nov. 16, 2009

(65) Prior Publication Data

US 2010/0122720 A1  May 20, 2010

Related U.S. Application Data

(63) Continuation-in-part of application No. 12/408,297, filed on Mar. 20, 2009, and a continuation-in-part of application No. 12/510,977, filed on Jul. 28, 2009, and a continuation-in-part of application No. 11/828,964, filed on Jul. 26, 2007.

(51) Int. Cl.
*H01L 31/055* (2006.01)
*H01L 31/028* (2006.01)

(52) U.S. Cl. ........................ 136/257; 136/261

(58) Field of Classification Search .................. 136/261, 136/257

See application file for complete search history.

(56) References Cited

U.S. PATENT DOCUMENTS

| | | | |
|---|---|---|---|
| 4,842,960 A | 6/1989 | Lindmayer | |
| 4,891,507 A | 1/1990 | Lindmayer | |
| 5,012,098 A | 4/1991 | Lindmayer | |
| 6,541,788 B2 | 4/2003 | Petroff | |
| 6,621,211 B1 * | 9/2003 | Srivastava et al. | 313/503 |
| 6,734,453 B2 | 5/2004 | Atanackovic | |
| 6,852,575 B2 | 2/2005 | Bojarczuk et al. | |
| 6,858,864 B2 | 2/2005 | Atanackovic | |
| 6,943,385 B2 | 9/2005 | Usuda | |
| 7,008,559 B2 | 3/2006 | Chen | |

(Continued)

OTHER PUBLICATIONS

Curtin, B.M.;"Photonic crystal back-reflectors for light management and enhanced absorption in a-Si:H solar cells"; M.Sc. Thesis, 2009; Iowa State University.

(Continued)

*Primary Examiner* — Jennifer K. Michener
*Assistant Examiner* — Dustin Q Dam
(74) *Attorney, Agent, or Firm* — Fernandez & Associates, LLP (57) ABSTRACT

The use of rare-earth (RE+O, N, P) based materials to transition between two semiconductor materials is disclosed. Rare earth based oxides, nitrides and phosphides provide a wide range of lattice spacings enabling, compressive, tensile or stress-free lattice matching with Group IV, III-V, and Group II-VI compounds. Disclosed embodiments include tandem solar cells.

15 Claims, 9 Drawing Sheets

U.S. PATENT DOCUMENTS

| | | |
|---|---|---|
| 7,018,484 B1 | 3/2006 | Atanackovic |
| 7,023,011 B2 | 4/2006 | Atanackovic |
| 7,037,806 B1 | 5/2006 | Atanackovic |
| 7,129,551 B2 | 10/2006 | Osten |
| 7,135,699 B1 | 11/2006 | Atanackovic |
| 7,199,015 B2 | 4/2007 | Atanackovic |
| 7,199,451 B2 | 4/2007 | Kelman |
| 7,211,821 B2 | 5/2007 | Atanackovic |
| 7,217,636 B1 | 5/2007 | Atanackovic |
| 7,253,080 B1 | 8/2007 | Atanackovic |
| 7,273,657 B2 | 9/2007 | Atanackovic |
| 7,351,993 B2 | 4/2008 | Atanackovic |
| 7,384,481 B2 | 6/2008 | Atanackovic |
| 7,416,959 B2 | 8/2008 | Atanakovic |
| 7,432,550 B2 | 10/2008 | Bojarczuk et al. |
| 7,501,627 B1 | 3/2009 | Herr |
| 2005/0145972 A1* | 7/2005 | Fukuda et al. ............... 257/458 |
| 2005/0156155 A1* | 7/2005 | Atanackovic ................. 257/19 |
| 2005/0161773 A1 | 7/2005 | Atanackovic |
| 2005/0163692 A1 | 7/2005 | Atanackovic |
| 2006/0060826 A1 | 3/2006 | Atanackovic |
| 2006/0145186 A1* | 7/2006 | Wallis ........................ 257/190 |
| 2008/0241519 A1 | 10/2008 | Shroeder |
| 2009/0183774 A1 | 7/2009 | Atanackovic |
| 2009/0235974 A1* | 9/2009 | Mapel et al. ................ 136/246 |

OTHER PUBLICATIONS

Hetzer, M.J.; "Chemical and electronic characterization of copper indium gallium diselenide thin film solar cells and correlation of these characterisitics to solar cell operation"; Ph.D. thesis, 2009; Ohio State University.

Zhou, D.; "Light-trapping enhancement in thin film solar cells"; M.Sc. thesis, 2008; Iowa State University.

Mutitu, J.G., et al.; "Thin film silicon solar cell design based on photonic crystal and diffractive grating structures"; Optics Express; 16, #19, Sep. 15, 2008; 15238.

Dewan, R., et al; "Light trapping in thin-film silicon solar cells with integrated diffraction grating"; Jl. Appl. Physics, 106, 074901, 2009.

Bermal, P., et al.; "improving Thin-Film Crystalline Silicon Solar Cell Efficiencies With Photonic Crystals"; Optics Express; 15, #15, Dec. 10, 2007; 16986.

Richards, B., et al.; "Enhancing the near-infrared spectral response of silicon optoelectronic devices via up-conversion"; IEEE Transactions on Electron Devices, 54, #10, Oct. 2007.

Sewell, R.H., et al.; "Epitaxial rare-earth oxide layers for enhancement of silicon based solar cells"; 24th European Photovoltaic Solar Energy Conference 2009.

* cited by examiner

Characteristic x-ray for $(Gd_{0.85}Nd_{0.15})_2O_3$ on Si

PASSIVE RARE EARTH TANDEM SOLAR CELL

PRIORITY

This application is a continuation-in-part of application Ser. No. 11/828,964, filed on Jul. 26, 2007, Ser. No. 12/408,297, filed on Mar. 20, 2009 and Ser. No. 12/510,977, filed on Jul. 28, 2009 and claims priority from these applications, all three included herein in their entirety by reference.

CROSS REFERENCE TO RELATED APPLICATIONS

Applications and patents Ser. Nos. 11/025,692, 11/025,693, U.S.20050166834, Ser. Nos. 11/253,525, 11/257,517, 11/257,597, 11/393,629, 11/472,087, 11/559,690, 11/599,691, 11/788,153, 11/828,964, 11/858,838, 11/873,387, 11/960,418, 11/961,938, 12/119,387, 60/820,438, 61/089,786, 12/029,443, 12/046,139, 12/111,568, 12/119,387, 12/171,200, 12/408,297, 12/510,977, 60/847,767, U.S. Pat. No. 6,734,453, U.S. Pat. No. 6,858,864, U.S. Pat. No. 7,018,484, U.S. Pat. No. 7,023,011 U.S. Pat. No. 7,037,806, U.S. Pat. No. 7,135,699, U.S. Pat. No. 7,199,015, U.S. Pat. No. 7,211,821, U.S. Pat. No. 7,217,636, U.S. Pat. No. 7,273,657, U.S. Pat. No. 7,253,080, U.S. Pat. No. 7,323,737, U.S. Pat. No. 7,351,993, U.S. Pat. No. 7,355,269, U.S. Pat. No. 7,364,974, U.S. Pat. No. 7,384,481, U.S. Pat. No. 7,416,959, U.S. Pat. No. 7,432,569, U.S. Pat. No. 7,476,600, U.S. Pat. No. 7,498,229, U.S. Pat. No. 7,586,177, U.S. Pat. No. 7,599,623 and U.S. Applications titled "Photovoltaic conversion using rare earths plus Group IV sensitizers", [P047]; "Photovoltaic conversion using rare earths plus transition metal sensitizers", [P048]; "Rare earth structures with semiconductor layers", [P046]; "Passive rare earth tandem solar cell", [P050]; and "Active rare earth tandem solar cell", [P051], all held by the same assignee, contain information relevant to the instant invention and are included herein in their entirety by reference. References, noted in the specification and Information Disclosure Statement, are included herein in their entirety by reference.

BACKGROUND OF THE INVENTION

1. Field of the Invention

The invention relates generally to semiconductor based structures for a passive tandem solar cell transitioning from one semiconductor material composition to another by the use of one or more transition layers comprising one or more rare earth compounds.

2. Description of Related Art Including Information Disclosed Under 37 CFR 1.97 and 1.98

It is widely accepted that a single junction, single crystal silicon solar cell has an optimum performance in the wavelength range 500 to 1,100 nm; the solar spectrum extends from 400 nm to in excess of 2,500 nm. A tandem cell enables a device to convert a larger portion of the solar spectrum with minimal increase in size and cost.

Rare earths, the lanthanide series, have long been known for the unique optical properties in which the incomplete, 4f shells exhibit multiple optical transitions many of which lie within the solar spectrum. An example of some of these optical transitions are: Er: 410, 519, 650, 810, 972, 1,529 nm; Yb: 980 nm; Tb: 485 nm. As used herein a rare earth, [RE1, RE2, . . . RE$_n$], is chosen from the lanthanide series of rare earths from the periodic table of elements {$^{57}$La, $^{58}$Ce, $^{59}$Pr, $^{60}$Nd, $^{61}$Pm, $^{62}$Sm, $^{63}$Eu, $^{64}$Gd, $^{65}$Tb, $^{66}$Dy, $^{67}$Ho, $^{68}$Er, $^{69}$Tm, $^{70}$Yb and $^{71}$Lu} plus yttrium, $^{39}$Y, and scandium, $^{21}$Sc, are included as well for the invention disclosed.

As used herein a transition metal, [TM1, TM2 . . . TM$_n$], is chosen from the transition metal elements consisting of {$^{22}$Ti, $^{23}$V, $^{24}$Cr, $^{25}$Mn, $^{26}$Fe, $^{27}$Co, $^{28}$Ni, $^{29}$Cu, $^{30}$Zn, $^{40}$Zr, $^{41}$Nb, $^{42}$Mo, $^{43}$Tc, $^{44}$Ru, $^{45}$Rh, $^{46}$Pd, $^{47}$Ag, $^{48}$Cd, $^{71}$Lu, $^{72}$Hf, $^{73}$Ta, $^{74}$W, $^{75}$Re, $^{76}$Os, $^{77}$Ir, $^{78}$Pt, $^{77}$Au, $^{80}$Hg}. Silicon and germanium refer to elemental silicon and germanium; Group IV, Groups III and V and Groups II and VI elements have the conventional meaning. As used herein all materials and/or layers may be present in a single crystalline, polycrystalline, nanocrystalline, nanodot or quantum dot and amorphous form and/or mixture thereof.

In addition certain of these rare earths, sometimes in combination with one or more rare earths, and one or more transition metals can absorb light at one wavelength (energy) and re-emit at another wavelength (energy). This is the essence of conversion; when the incident, adsorbed, radiation energy per photon is less than the emission, emitted, energy per photon the process is referred to as "up conversion". "Down conversion" is the process in which the incident energy per photon is higher than the emission energy per photon. An example of up conversion is Er absorbing at 1,480 nm and exhibiting photoluminescence at 980 nm.

U.S. Pat. No. 6,613,974 discloses a tandem Si—Ge solar cell with improved efficiency; the disclosed structure is a silicon substrate onto which a Si—Ge epitaxial layer is deposited and then a silicon cap layer is grown over the Si—Ge layer; no mention of rare earths is made. U.S. Pat. No. 7,364,989 discloses a silicon substrate, forming a silicon alloy layer of either Si—Ge or Si—C and the depositing a single crystal rare earth oxide, binary or ternary; the alloy content of the alloy layer is adjusted to select a type of strain desired; the preferred type of strain is "relaxed"; the preferred deposition method for the rare earth oxide is atomic layer deposition at temperatures below 300° C. While the Si—Ge film is "relaxed", its primary function is to impart no strain, tensile strain or compressive strain to the rare earth oxide layer; the goal being to improve colossal magnetoresistive, CMR, properties of the rare earth oxide. A preferred method disclosed requires a manganese film be deposited on a silicon alloy first. Recent work on rare earth films deposited by an ALD process indicate the films are typically polycrystalline or amorphous.

U.S. Pat. No. 7,148,417 discloses a first solar cell comprising silicon and a second GaP solar cell. U.S. Pat. No. 6,613,974 discloses a second solar cell comprising silicon-germanium formed on a silicon substrate. U.S. Pat. No. 6,566,595 discloses a tandem solar cell comprising a compound semiconductor and a quantum well layer of a second compound semiconductor. U.S. Pat. No. 6,372,980 discloses a two terminal tandem solar cell comprising InGaAs and GaAs. U.S. Pat. No. 6,340,788 discloses a Si or SiGe solar cell comprising multiple subcells; optionally, transition layer(s) of GaPAs and GaInP are part of the structure. U.S. Pat. No. 6,166,320 discloses a tandem solar cell comprising A first solar cell stacked upon a second solar cell. The cited prior art does not disclose a tandem solar cell comprising a rare earth transition layer of varying composition.

BRIEF SUMMARY OF THE INVENTION

The use of rare-earth based materials to transition between two semiconductor materials is disclosed. Rare earth based oxides, nitrides and phosphides provide a wide range of lattice spacings enabling, compressive, tensile or stress-free lattice matching with Groups IV, III-V, and II-VI compounds.

In one embodiment the instant invention discloses materials as thin films operable as a tandem solar cell device. One advantage of thin films is the control provided over a process both in tuning a material to a particular wavelength and in reproducing the process in a manufacturing environment. In some embodiments, rare earth oxides, nitrides, and phosphides, and silicon/germanium materials and various combinations thereof are employed. As used herein the terms, REO, "oxides" and "rare-earth oxide[s]" are inclusive of rare earth oxides, nitrides, and phosphides and combinations thereof.

BRIEF DESCRIPTION OF THE SEVERAL VIEWS OF THE DRAWING(S)

FIGS. 8a and b: Specific embodiment of a REO transition layer including X-ray data of a test vehicle.

DETAILED DESCRIPTION OF THE INVENTION

In embodiments of the instant invention a substrate may be a semiconductor, such as silicon, in single or poly or multi-crystalline form; alternatively, silicon dioxide, glass or alumina. As used herein poly or multi-crystalline includes poly, micro and nano crystalline. The number of REO/Si(1-y)Ge (y) bilayers may range from one to more than one hundred. "A layer" may also comprise multiple layers. REO, Si(1-x)Ge(x), Si(1-y)Ge(y), and Si(1-z)Ge(z), alternatively, $[Si_{1-x}Ge_x]_m$, layers are, optionally, single crystal, multi-crystalline or amorphous layers and are compatible with semiconductor processing techniques. As used herein a "REO" layer contains two or more elements, at least one chosen from the Lanthanide series plus Scandium and Yttrium and at least one chosen from oxygen and/or nitrogen and/or phosphorous and/or mixtures thereof; structures are not limited to specific rare-earth elements cited in examples. Rare earth materials are represented as $(RE1+RE2+ \ldots REn)_mO_n$, where the total mole fraction of rare earths, $1 \ldots n$, is one for stoichiometric compounds; non-stoichiometric compounds are also disclosed. In some embodiments, in addition to the RE $(1, 2, \ldots n)$ an alloy may include Si and/or Ge and/or C, carbon; optionally an oxide may be an oxynitride or oxyphoshide; in general rare earth compounds are described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$.

In some embodiments a low cost substrate such as soda glass or polycrystalline alumina is used in combination with a rare-earth based structure comprising a diffusion barrier layer, a buffer layer, an active region, up and/or down layer(s), one or more reflectors, one or more Bragg layers, texturing is optional; one or more layers may comprise a rare-earth; one or more layers may comprise a semiconductor, such as $[Si_{1-x}Ge_x]_m$, denoting a plurality of layers, each layer comprising a different SiGe alloy; for example: $REO/(Si_{1-x}Ge_x)/(Si_{1-y}Ge_y)/(Si_{1-z}Ge_z)$/etc., wherein $0 \leq$, x, y, $z \leq 1$ and m, denoting the number of layers may vary from 1 to 50. The exact sequence of the layers is application dependent; in some embodiments comprising a tandem solar cell sunlight may enter a transparent substrate initially; in other cases a transparent substrate may be interior of multiple layers.

Figure 1:
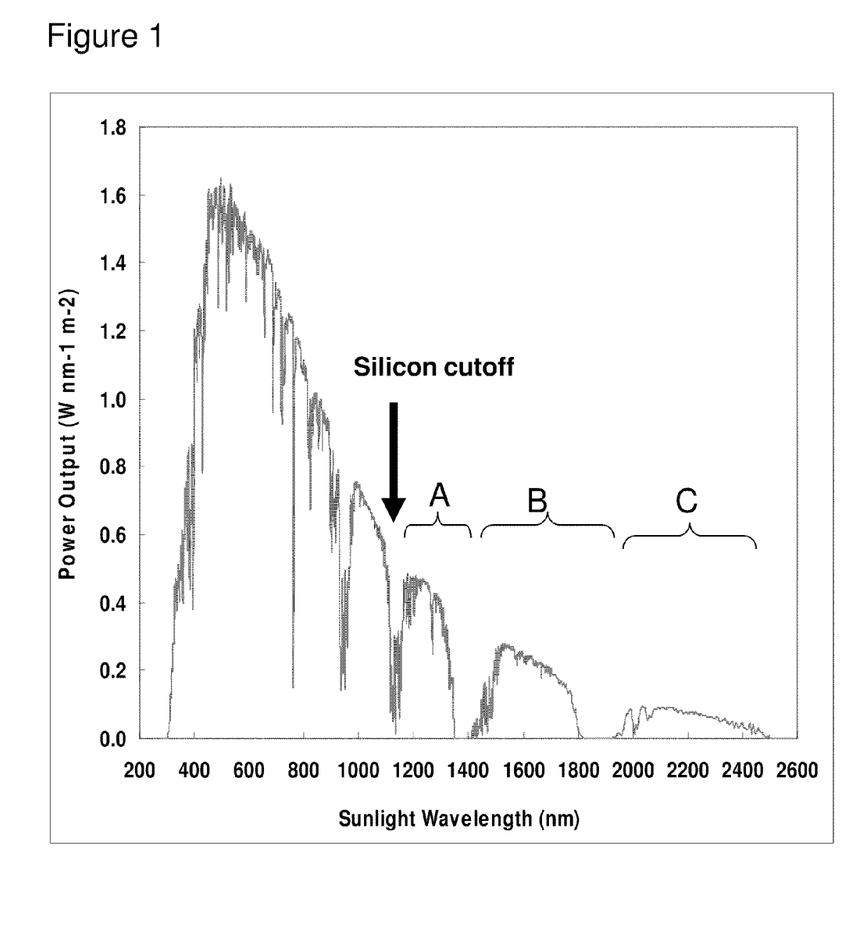
FIG. 1: Solar spectrum showing portion of spectrum absorbed by silicon and portion, A, B and C, available for additional conversion by SiGe.
Figure 2:
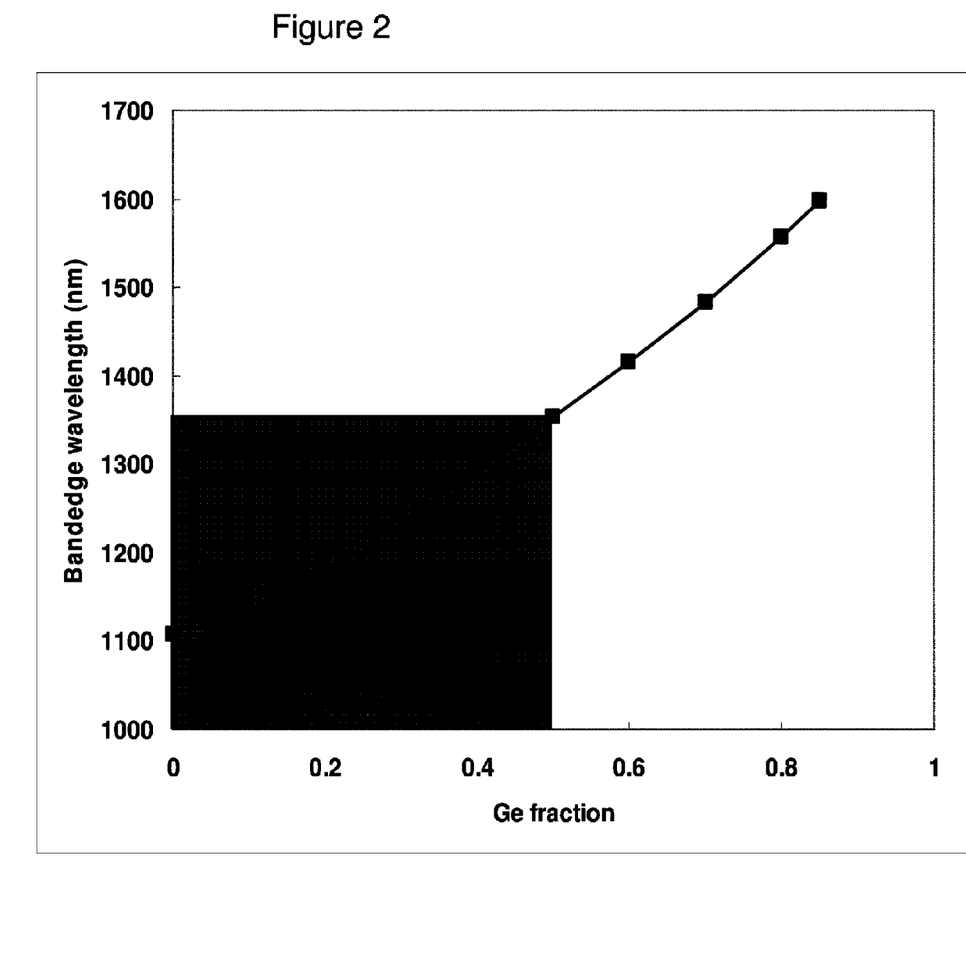
FIG. 2: Composition of SiGe required to extend cutoff wavelength to include region A.
Figure 3:
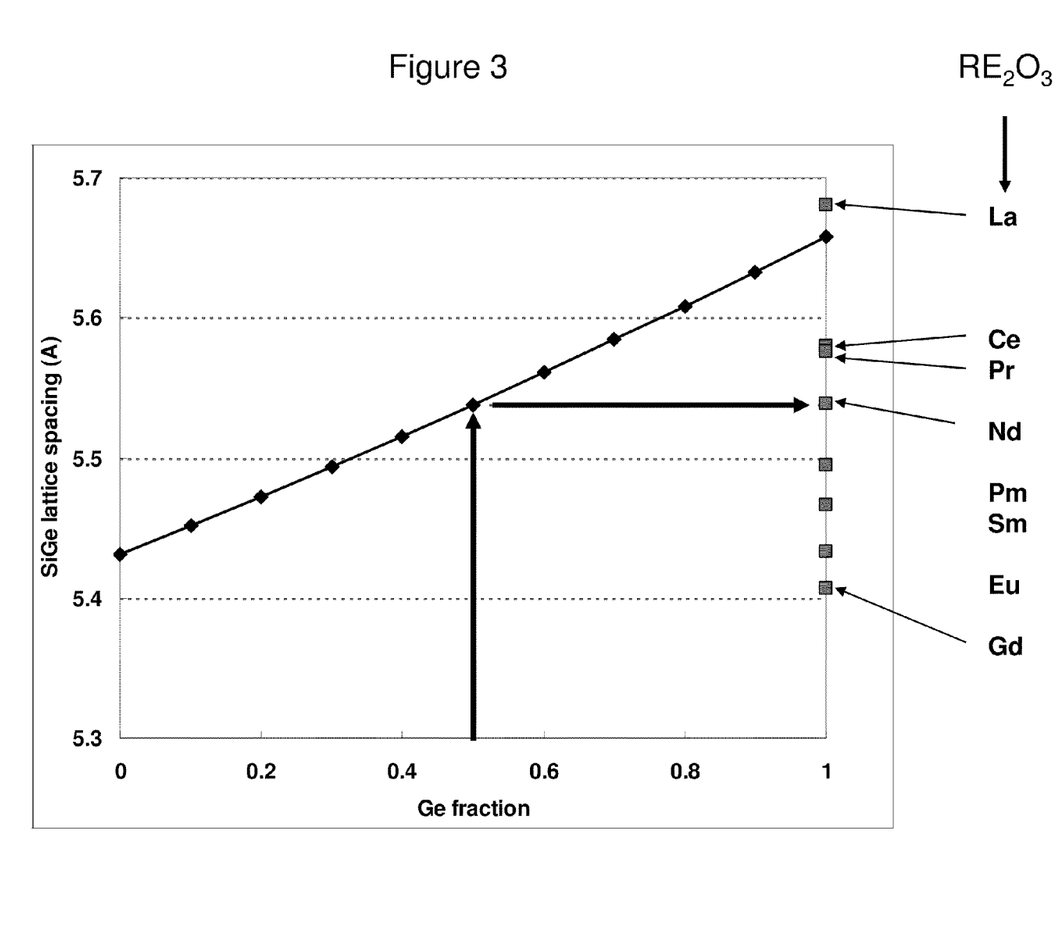
FIG. 3: Relationship between SiGe lattice spacing and rare earth, REO, lattice spacing
Figure 4:
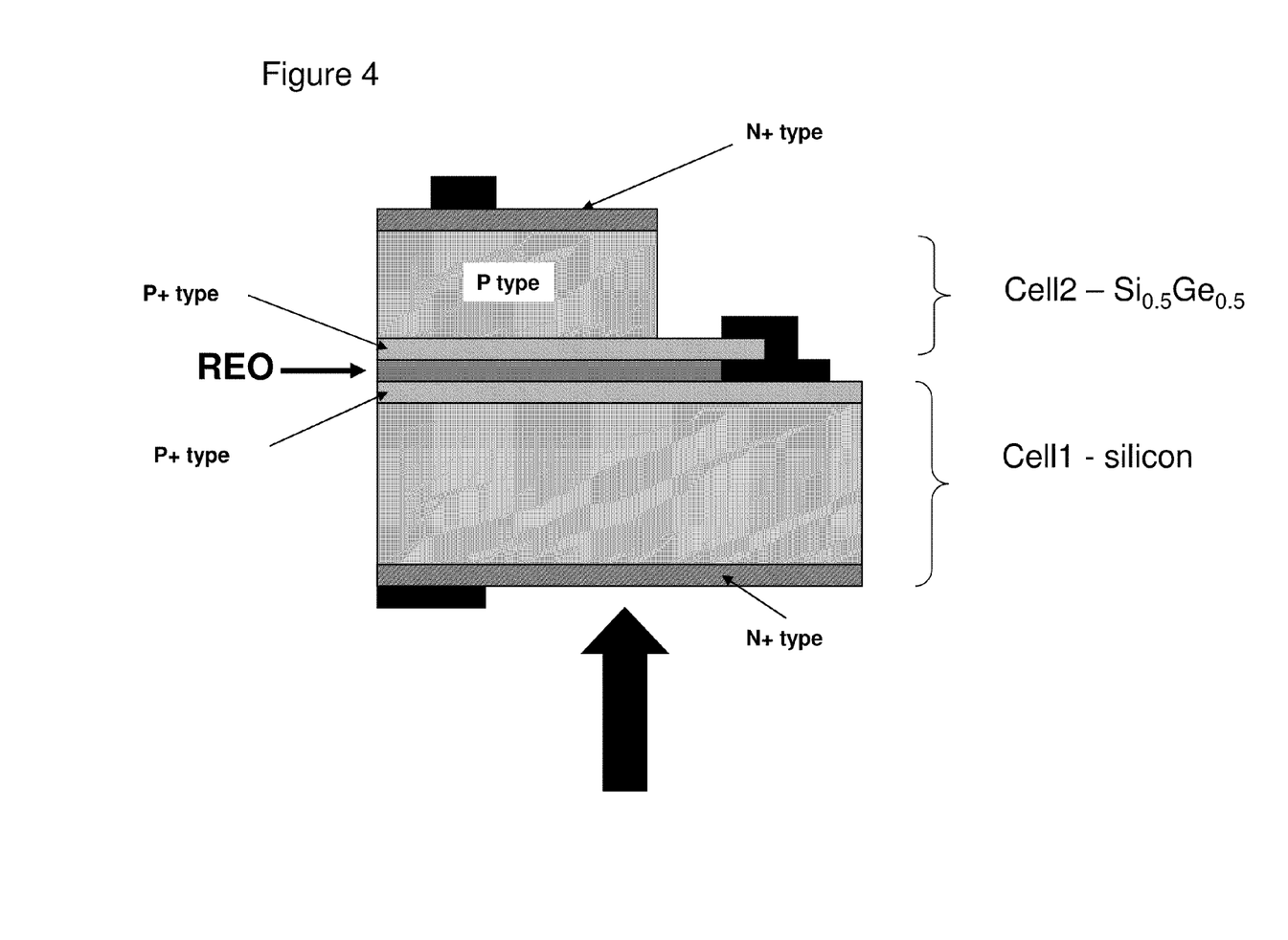
FIG. 4: An example of 3 terminal bifacial tandem cell incorporating REO layer
Figure 5:
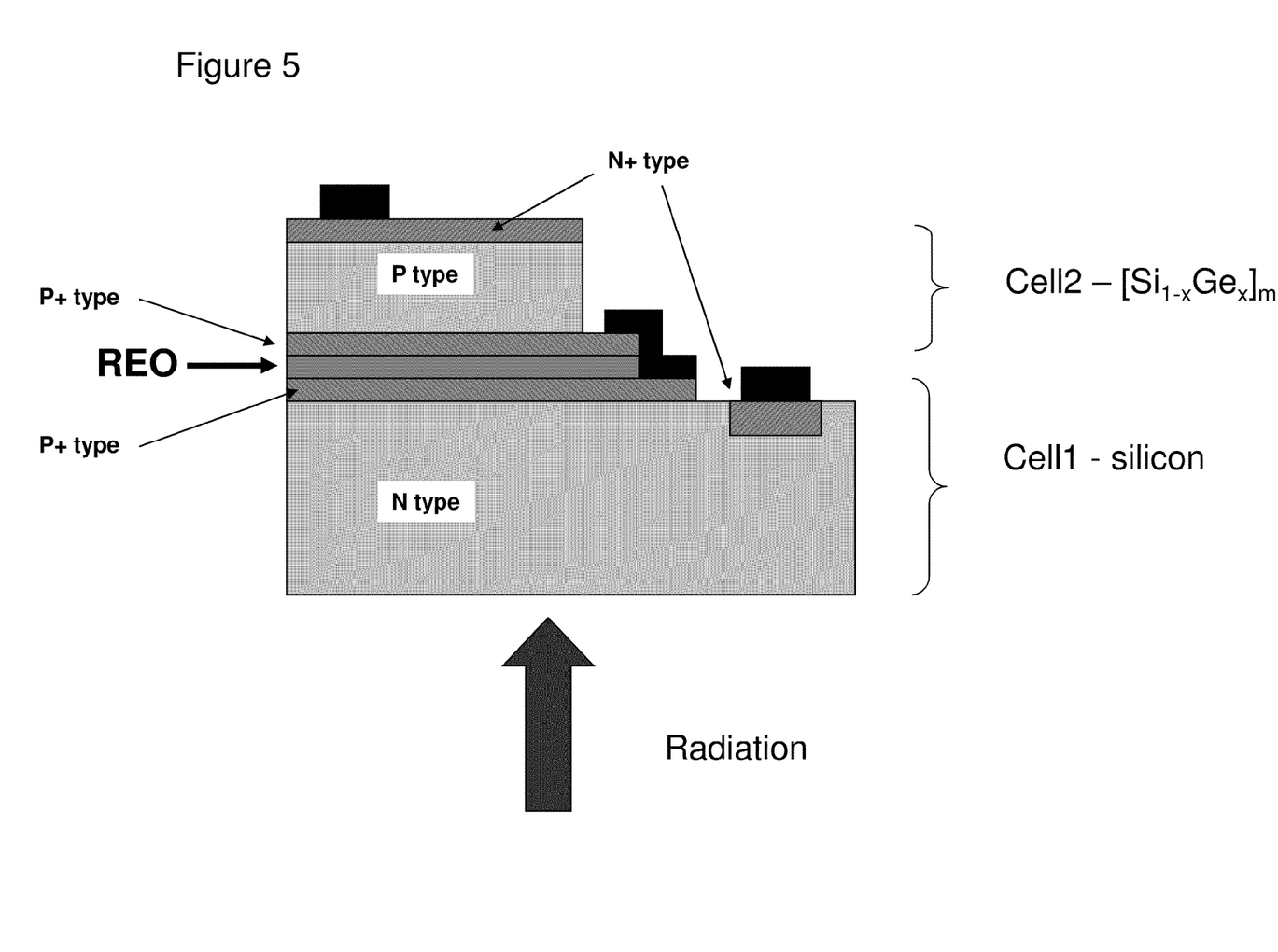
FIG. 5: An example of 3 terminal dual back contact tandem cell incorporating REO layer and multiple $[Si_{1-x}Ge_x]_m$ layers.
Figure 6:
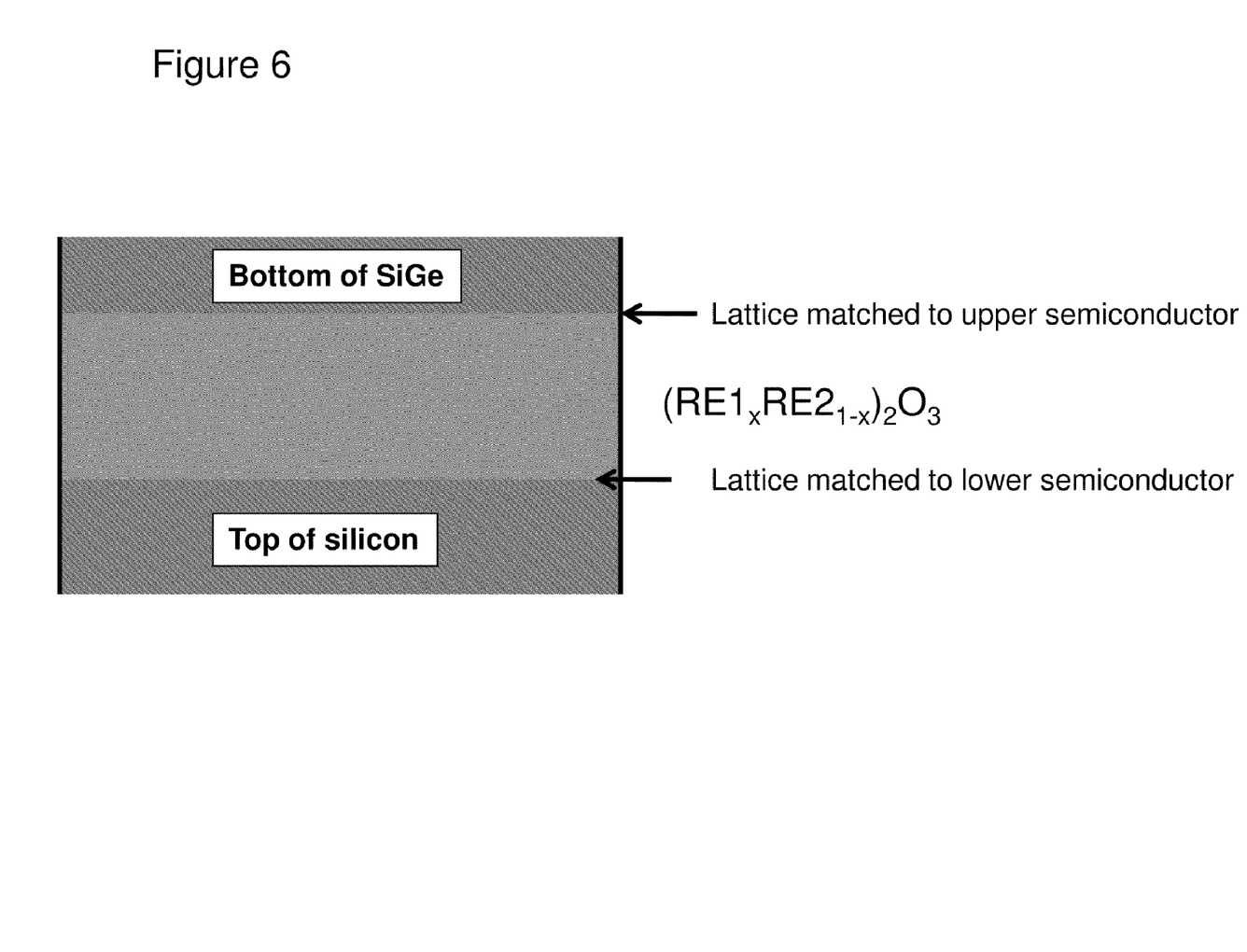
FIG. 6: Detail of REO transition region defining attributes of the REO layer

FIG. 1 shows the solar spectrum and portions, A, B and C available for conversion by a solar cell of smaller band gap than standard silicon. FIG. 2 shows the variation of germanium content in a SiGe alloy versus the wavelength of incident radiation with energy at the upper band gap edge. FIG. 3 shows the SiGe alloy lattice spacing versus Ge content and the lattice spacing of various rare earth compounds, REO. FIG. 4 is one embodiment of the instant invention; a silicon based solar cell operates in "tandem" with a SiGe based solar cell such that the SiGe cell receives radiation not converted by the silicon cell. The two cells are connected by a REO transition layer deposited on the initial, optionally, silicon cell; the REO layer enables a second solar cell, optionally, $Si_{1-x}Ge_x$, to be grown or deposited on top of the Si/REO structure. Optionally, the silicon and REO and SiGe layers are single crystal, poly-crystalline, micro or nano-crystalline or re-crystallized large grains, optionally, formed by post thermal processing. FIG. 5 shows schematically an alternative cell and electrode connections. As shown, a second solar cell comprises a $[Si_{1-x}Ge_x]_m$ structure wherein m may vary from 1 to 50; in FIG. 5 m equals one. Alternatively in FIG. 5, the first solar cell, or cell 1, may also be a structure of the type $[Si_{1-x}Ge_x]_m$ versus silicon as shown in the figure. FIG. 6 shows a key feature of the instant invention; in some embodiments a REO layer is lattice matched at an interface to the solar cell material just below it or just above it in a growth sequence frame of reference. As in exemplary FIG. 6, a $(RE1_xRE2_{1-x})_2O_3$ of first composition is lattice matched to a silicon surface; a $(RE1_yRE2_{1-y})_2O_3$ of second composition is lattice matched to a silicon-germanium surface, $[Si_{1-x}Ge_x]$; in alternative embodiments exemplary compounds may be $(RE1_xRE2_{1-x})_2O_3$ (lower) and $(RE3_yRE4_{1-y})_2O_3$ (upper); in general REO layers described by $[RE1]_v[RE2]_w[RE3]_x[J1]_y[J2]_z$ wherein [RE] is chosen from rare earth; [J1] and [J2] are chosen from a group consisting of Oxygen (O), Nitrogen (N), and Phosphorus (P), and $0 \leq v, w, z \leq 5$, and $0 < x, y \leq 5$ are disclosed as possible transition layers.

Figure 7A:
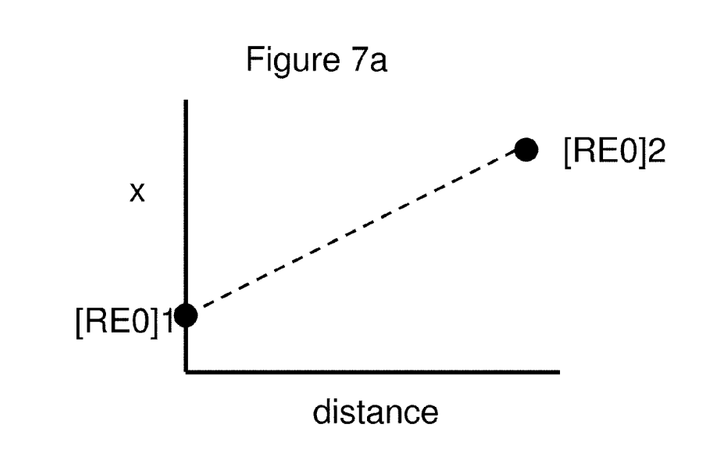
FIGS. 7a, b, c, d: Examples of REO composition grading in a transition layer.
Figure 7B:
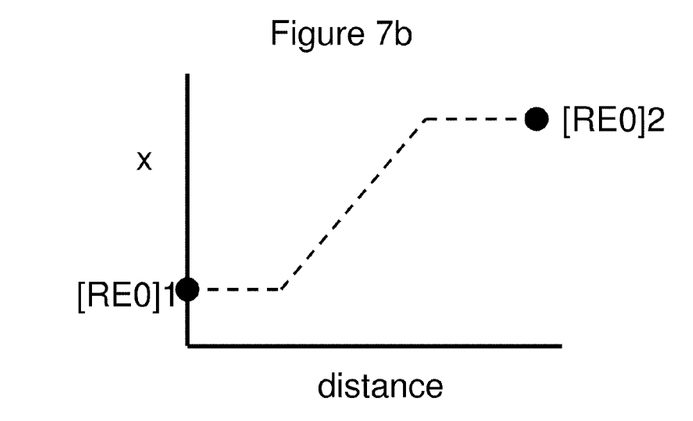
Figure 7C:
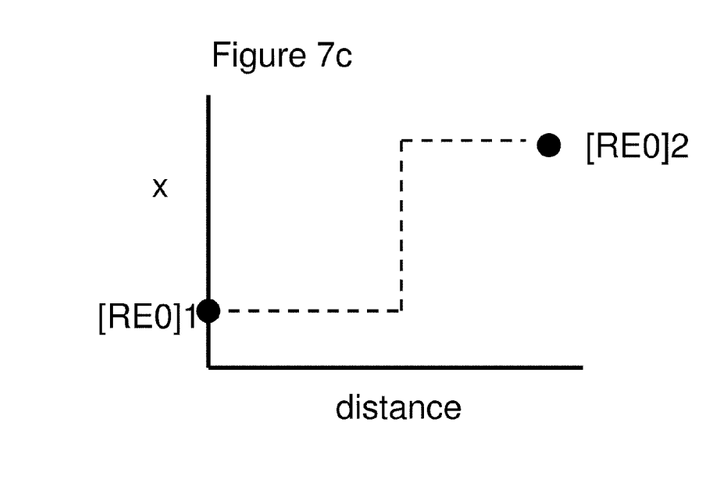
Figure 7D:
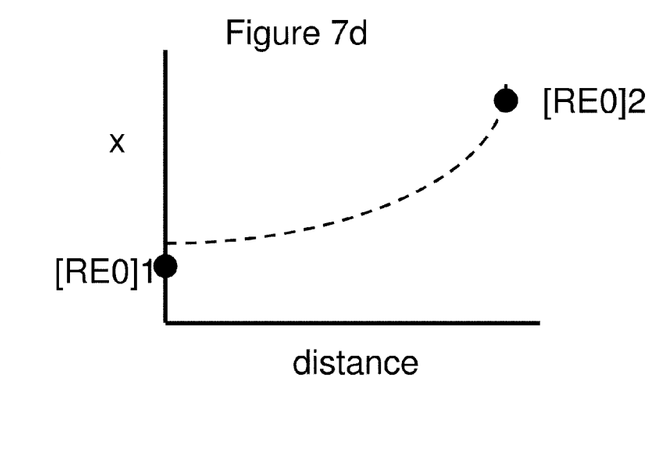
Figures 8A, 8B:
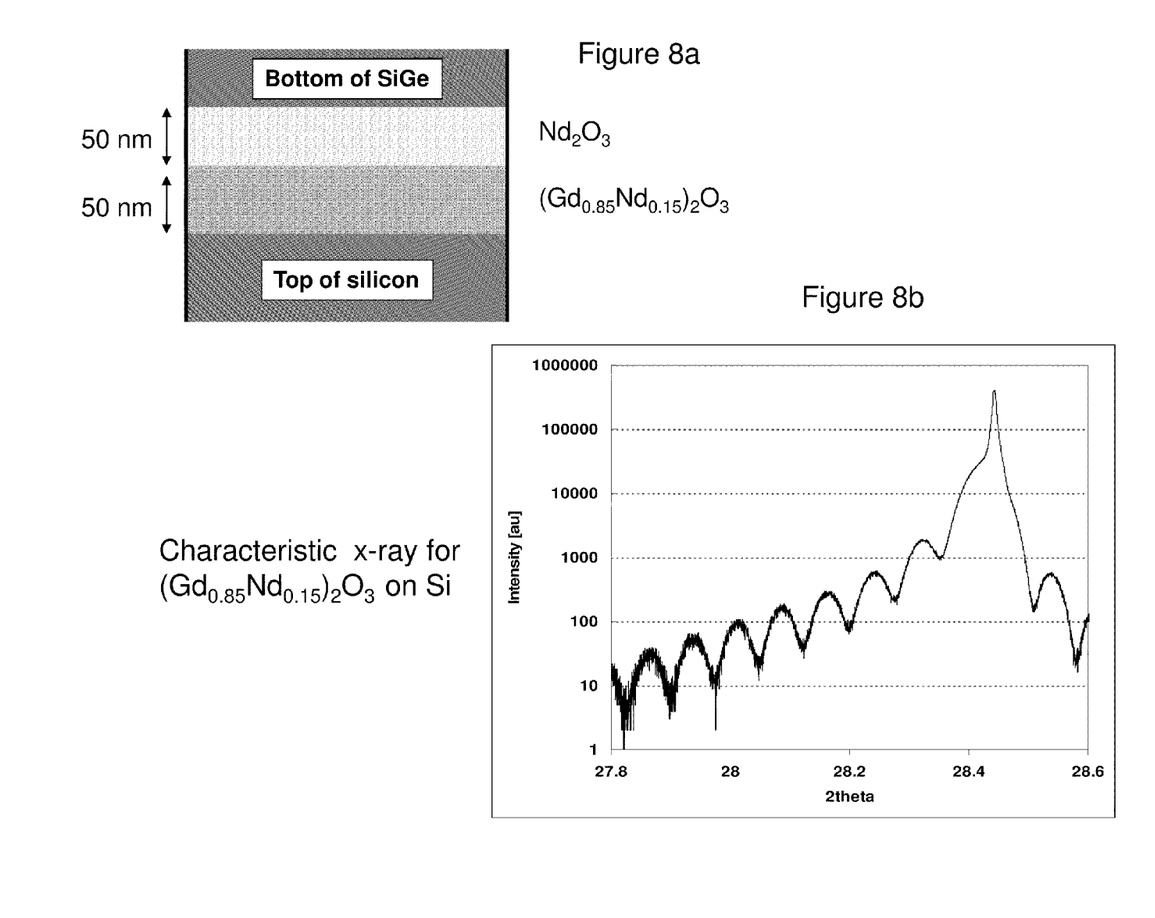

FIG. 7a shows one exemplary composition variation of a rare earth transition layer from a lower surface to an upper surface; in this embodiment the grading is linear from a first composition, [REO]1 to a second composition, [REO]2. FIG. 7b is an alternative scheme with a reduced linear variation grading; FIG. 7c shows a step function or digital step between first and second compositions; FIG. 7d shows a parabolic type grading; other grading schemes are possible including inter-digitated or superlattices or others known to one knowledgeable in the art. FIG. 8a is an example of an abrupt composition change between $(Gd_{0.85}Nd_{0.15})O_3$ and $Nd_2O_3$. An x-ray diffraction scan for $(Gd_{0.85}Nd_{0.15})O_3$ on silicon is shown in FIG. 8b, indicating close lattice matching; in alternative embodiments lattice matching may result in compressive or tensile strain in a lower or upper cell.

In some embodiments rare earth oxide, REO, layers are performing a task of strain balancing, such that the net strain in a REO/Si(1-y)Ge(y) composite layer is effectively reduced over that of a single REO layer of the same net REO thickness grown on the same structure, thus allowing a greater total thickness of REO to be incorporated into the structure before the onset of plastic deformation. In other embodiments rare earth oxide layers are strain balanced such that a critical thickness of a REO/Si(1-y)Ge(y) composite is not exceeded. In another embodiment a REO/Si(1-y)Ge(y) composite layer acts to mitigate propagation of dislocations from an underlying Si(1-x)Ge(x) layer through to an overlying Si(1-z)Ge(z) layer thereby improving the carrier lifetime in a Si(1-z)Ge(z) layer. In another embodiment, a Si(1-x)Ge(x) has a narrower band gap than a Si(1-z)Ge(z) layer (i.e. x>z) such that the Si(1-z)Ge(z) layer and the Si(1-x)Ge(x) layers form a tandem solar cell. For example, solar radiation impinges upon the Si(1-z)Ge(z) layer first where photons of energy greater than the band gap of Si(1-z)Ge(z) are absorbed and converted to electrical energy. Photons with energy less than the band gap of Si(1-z)Ge(z) are passed through to the Si(1-x)Ge(x) layer where a portion may be absorbed.

In some embodiments a device comprises a superlattice that includes a plurality of layers that form a plurality of repeating units, wherein at least one of the layers in the repeating unit is a layer with at least one species of rare earth ion wherein the repeating units comprise two layers wherein the first layer comprises a rare earth compound described by $[RE1]_x[J]_y$ and the second layer comprises a compound described by $((RE2_mRE3_n)_oJ_p$ wherein m, n, o, p, x, y>0 and J is chosen from a group comprising oxygen, nitrogen, phosphorous and combinations thereof; REO layers are described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$ are disclosed as possible transition layers.

As known to one knowledgeable in the art, a photovoltaic device may be constructed from a range of semiconductors including ones from Group IV materials, Group III-V materials and Group II-VI; additionally, photovoltaic devices such as a laser, LED and OLED may make advantageous use of the instant invention for up and/or down converting emitted light.

Figure 9:
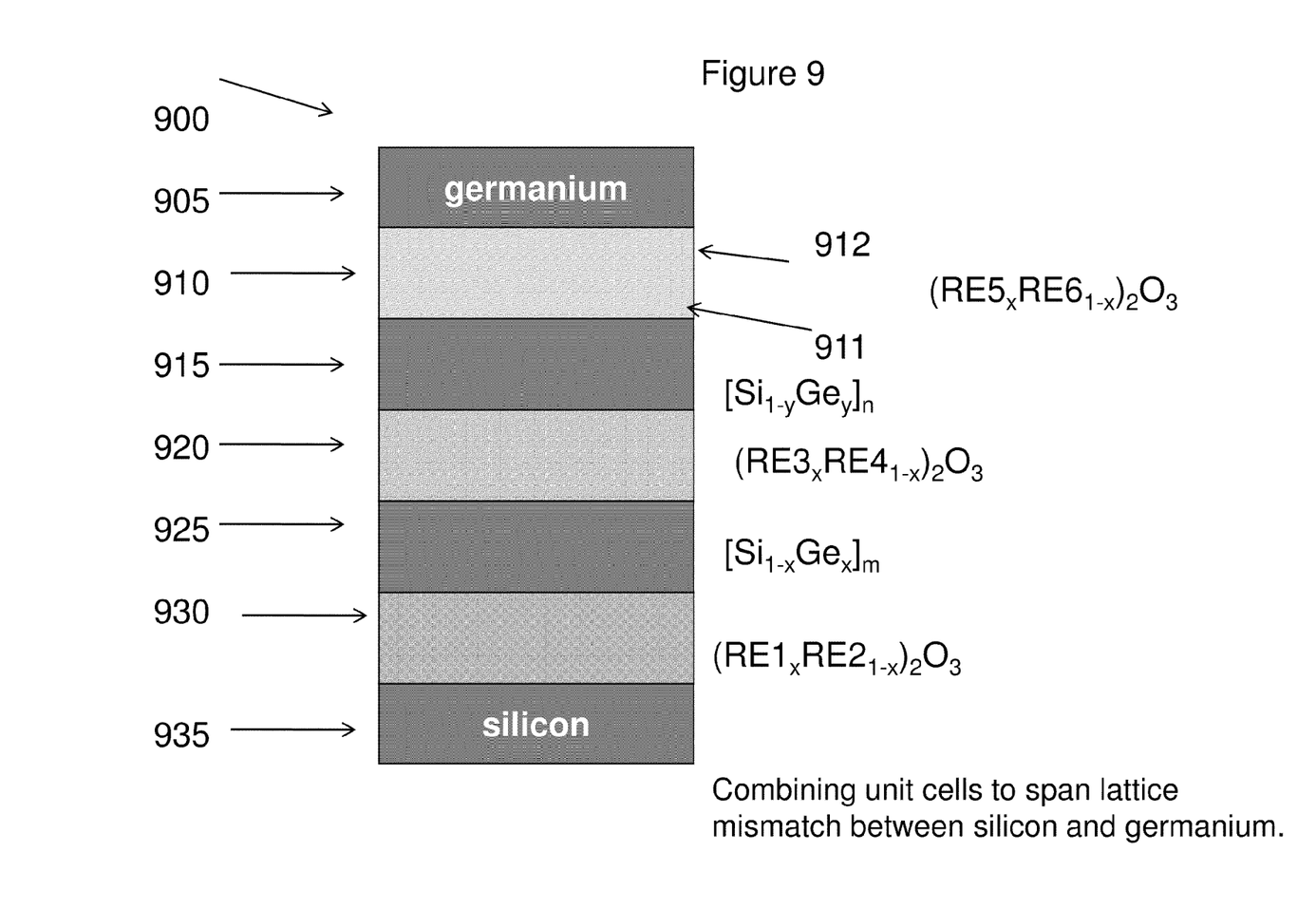
FIG. 9: Alternative embodiment of multiple tandem cells and multiple REO transition layers.

It is well known that multiple junction solar cells are capable of reaching higher conversion efficiencies than single junction cells, by extracting electrons at an energy closer to the original photon energy that produced the electron. In this invention we describe the use of single crystal or polycrystalline Si(1-x)Ge(x) alloys in combination with single crystal or polycrystalline silicon such that a two or more junction or a "tandem cell" is realized. A monolithic SiGe/Si structure is enabled through the use of a rare-earth oxide transition layer between the Si and SiGe as shown in FIG. 9. REO layers 910, 920, 930 may be one or a plurality of $[RE1]_a[RE2]_b[RE3]_c[O]_g[P]_h[N]_i$ type layers.

An example of a doping and interconnect scheme is a rear p-type region of a silicon cell is connected through to a p-type region of a SiGe cell by a metalized via through a REO channel. Alternatively REO layer 910 may be doped to form a conductive transition layer between Si and SiGe. Other embodiments are also possible, for example where p and n doping regions are reversed and a tunnel junction is used to create a two terminal device, rather than a three terminal device, as shown. Also possible is a device where a front metal contact and n-type doping region is placed at the back of the silicon layer, with a similar via contact scheme as is shown for the p-type silicon region. SiGe has a crystal lattice constant different to Si, such that when SiGe is deposited epitaxially directly on Si, the SiGe layer is strained. As the SiGe layer is grown thicker, the strain energy increases up to a point where misfit dislocations are formed in the SiGe film, which negatively impact performance of devices, including solar cell devices. In this invention, a REO transition layer serves as a strain relief layer between a first $[Si_{1-x}Ge_x]$ layer and a second $[Si_{1-y}Ge_y]$ layer, such that misfit dislocations are preferentially created in the REO layer, thus reducing the dislocation density in a $[Si_{1-m}Ge_m]$ type layer; alternatively a $[Si_{1-x}Ge_x]$ layer may comprise multiple, $[Si_{1-x}Ge_x]_m$ layers. A REO layer may also have compositional grading such that the REO surface in contact with a lower, optionally silicon, layer is lattice matched to silicon, while the REO surface in contact with an upper, optionally $[Si_{1-x}Ge_x]$, layer is lattice matched to $[Si_{1-x}Ge_x]$. For example, $(Gd_{0.81}Nd_{0.19})_2O_3$ has a lattice spacing of 10.863 Å, which is about twice the lattice spacing of silicon (10.8619 Å). For Si0.43Ge0.57, the band gap is 0.884 eV which allows the SiGe layer to absorb solar radiation in the band between 1100 to 1400 nm. Twice the lattice spacing of $Si_{0.43}Ge_{0.57}$ is 11.089 Å which is close to the lattice spacing of $Nd_2O_3$ (11.077 Å). Thus, by grading the composition of the REO layer from $(Gd_{0.81}Nd_{0.19})_2O_3$ to $Nd_2O_3$, the strain and dislocation network may be confined to the REO layer, thereby increasing the carrier lifetime and performance of the SiGe cell over that which would be obtained if the SiGe were grown directly on the Si. The instant invention discloses the use of a rare earth transition layer to function as a sink or getter for lattice defects created by the lattice mismatch between a first semiconductor layer and a rare earth layer transitioning to a second semiconductor layer.

X-ray diffraction measurements were performed by using a Phillips X'pert Pro four circle diffractometer. Incident Cu Kα1 beam was conditioned using a Ge (220) four-bounce monochromator; diffracted beam was passed through a channel cut, two bounce (220) Ge analyzer in order to achieve higher resolution. The Bragg reflection from the Si (111) planes was measured to analyze the lattice parameter of the grown structure. X-ray diffraction spectrum shows intensity modulations around the fundamental reflections of the substrate, indicating a smooth epitaxial layer terminally.

In prior art of the same assignee a rare earth based structure is disclosed comprising a first and second region wherein the first region has a first and second surface and the second region has a first and second surface; and the second region has a composition of the form $[RE1]_v[RE2]_w[RE3]_x[J1]_y[J2]_z$, wherein [RE] is chosen from the disclosed rare earth group; [J1] and [J2] are chosen from a group consisting of oxygen (O), nitrogen (N), and phosphorus (P); wherein $0 \leq v, w, z \leq 5$; and $0 < x, y \leq 5$ such that the second region has a composition different than the first region and wherein the first surface of the second region is in direct contact with the second surface of the first region and the first region is comprised of a composition of the form $[RE1]_a[RE2]_b[RE3]_c[J1]_d[J2]_e$, wherein [RE] is chosen from the disclosed rare earth group; [J1] and [J2] are chosen from a group consisting of oxygen (O), nitrogen (N), and phosphorus (P); wherein $0 \leq b, c, e \leq 5$; and $0 < a, d \leq 5$. In some embodiments one or more rare earth layers enable a transition from a semiconductor material of a first type and/or composition and/or orientation to a semiconductor material of a second type, composition and/or orientation; an embodiment is depicted in FIG. 6a. As disclosed herein rare earth layers may function as a transition layer(s) between, for example, a silicon layer(s) and a germanium layer(s) such that the rare-earth layer(s) acts as a sink for defects attempting to propagate from an initial layer, optionally a silicon layer, to a final layer, optionally a germanium layer, during a growth or deposition process. A REO layer, operable as a transition layer, enables, for example, a $Si_{(1-m)}Ge_m$ layer to be grown or deposited on a different composition $Si_{(1-n)}Ge_n$ layer to a range thicker than conventional critical layer thickness hence enabling different device structures; for example, one device may be a tandem solar cell where more efficient absorption of a portion of the spectrum not adsorbed by a first solar junction is enabled.

A growth or deposition process may be any one, or combination, of those known to one knowledgeable in the art; exemplary processes include CVD, MOCVD, PECVD, MBE, ALE, PVD, electron beam evaporation, multiple source PVD. In some embodiments a rare-earth layer(s) functions as a transition region between similar or dissimi$_{lar_s}$em$_i$-conducting layers and also functions as an up and/or down con$_{verti}$ng region for converting a portion of incident radiation to higher or lower energy. An exemplary structure as shown in FIG. 9 may be a multiple-junction solar cell wherein a first region comprises a silicon p-n junction cell, a second region is a rare-earth transition region functioning as a defect sink and a third region is a germanium p-n junction cell; optionally, a first or third region may be Group IV, Group III-V or Group II-VI semiconductors.

In some embodiments a rare-earth layer transition region comprises a first rare-earth portion of first composition adjacent to a first semiconductor region, a second rare-earth portion of second composition adjacent to a second semiconductor region and a third rare-earth portion of third composition separating the first and second rare-earth portion; in some embodiments the third rare earth composition varies from the first rare-earth composition to the second rare-earth composition in a linear fashion; alternatively the third rare earth composition may vary in a step-wise fashion; alternatively, the third rare earth region may comprise multiple layers, each with a distinct composition determined by a desired stress profile to facilitate the capture and/or annihilation of lattice defects as may be generated by the transition from the first and second semiconductor regions during a growth process and subsequent process steps. In some embodiments a third rare earth region may transition from a compressive stress to a tensile stress based upon the beginning and ending compositions.

Referring additionally to FIG. 9, with individual layers or films 905-935 forming a composite structure 900, in accordance with the present invention. In some embodiments layer 910 comprises a first layer 911 and a second layer 912 wherein 911 has a width designated $d_a$ and layer 912 has a width designated $d_b$. Layer 911 has a bulk modulus Ma and layer 912 has a bulk modulus Mb. To produce a desired composite stress in the composite layer, the individual thicknesses ($d_a$ and $d_b$) required in each layer 911 and 912 can be calculated based on stress energy at the interface. Layer 911 and 912 may be separated a third layer, not shown, to enhance the functionality of composite layer 910 as a sink for lattice defects. In some embodiments $d_a$ and $d_b$ may be about 2 nm; in some embodiments $d_a$ and $d_b$ may be about 200 nm; alternatively, $d_a$ and $d_b$ may be between about 2 to about 200 nm; a third layer, not shown, may be between about 2 to about 200 nm.

Referring to FIG. 9, a specific example of a structure including a germanium semiconductor layer 905 on a composite rare earth layer 910, in accordance with the present invention, is illustrated. It is known that germanium has a large thermal and lattice mismatch with silicon. However, in many applications it is desirable to provide crystalline germanium active layers on silicon layers. In the present example, stressed layer 910 is adjacent a germanium layer 905 and stressed layer 930 is adjacent a silicon layer 935. Stressed layers 911 and 912 are engineered to produce a desired composite stress in composite layer 910. In some embodiments, compositions of stressed layers 910, 920 and 930 are chosen to reduce thermal mismatch between first and second semiconductor layers also.

High resolution transmission electron microscope image of another optional embodiment of rare-earth atom incorporated in silicon and/or silicon-germanium structures is shown in FIG. 94 of U.A. 2008/0295879. The germanium and erbium fractions may be used to tune the strain in the material. The Si/SiEr and Si/SiGeEr layers demonstrate that Ge is effective in reducing dislocation and threading dislocations vertically through the layers along the growth direction.

Atomic and molecular interstitial defects and oxygen vacancies in single crystal rare-earth oxide (REOx) can also be advantageously engineered via non-stoichiometric growth conditions. The atomic structure of singly and doubly positively charged oxygen vacancies ($O_v^+$, $O_v^{2+}$), and singly and doubly negatively charged interstitial oxygen atoms ($O_i^-$, $O_i^{2-}$) and molecules ($O_{2i}^-$, $O_{2i}^{2-}$) can be engineered in defective single crystals of $REO_{x=1.5\pm y}$, $0.1<y<1$). Singly and doubly negatively charged oxygen vacancies ($O_v^-$, $O_v^{2-}$) are also possible. Rare-earth metal ion vacancies and substitutional species may also occur and an oxygen vacancy paired with substitutional rare-earth atom may also occur. However, atomic oxygen incorporation is generally energetically favored over molecular incorporation, with charged defect species being more stable than neutral species when electrons are available from the rare-earth conduction band. Alternatively, nitrogen, N, or phosphorus, P, may replace the oxygen or used in various combinations.

Nitrogen-containing defects can be formed during growth of rare-earth-oxide using nitrogen and nitrogen containing precursors (e.g., $N_2$, atomic N, $NH_3$, NO, and $N_2O$). The role of such defects using nitrogen in oxides leads to an effective immobilization of native defects such as oxygen vacancies and interstitial oxygen ions and significantly reduce the fixed charge in the dielectric. Non-stoichiometric [REO] films can be engineered to contain oxygen interstitials, (e.g., using oxygen excess and/or activated oxygen $O_2^*$, $O^*$) and/or oxygen vacancies (e.g., using oxygen deficient environment).

The process of vacancy passivation by molecular nitrogen is also possible. Atomic nitrogen is highly reactive and mobile once trapped in the oxide structure resulting in the more effective passivation of oxygen vacancies. REO materials may generate positive fixed charge via protons and anion vacancies and can be effectively reduced by introduction of atomic nitrogen and/or molecular nitrogen.

Multilayer structures allow for the formation of low dislocation density material with low structure defects. Electronic propagation parallel and perpendicular to the plane of the layers is therefore improved compared to non-REO based structures. In some embodiments, a first semiconductor layer may be single crystal, polycrystalline, large grained crystalline or micro/nano crystalline; subsequent layers may also be single crystal, polycrystalline, large grained crystalline or micro/nano crystalline. As used herein, large grained is defined as a grain of lateral dimension much larger than the dimension in the growth direction.

In some embodiments a solid state device comprises a structure comprising a first region of first composition, a second region of second composition; and a third region of third composition separated from the first region by the second region; wherein the second region comprises a rare-earth compound and the third composition is different from the first composition; optionally, the third region comprises elements only from Group IV; optionally, third region comprises elements only from Groups III and V; optionally, third region comprises elements only from Groups II and VI; the composition of the second region is described by $[RE1]_v[RE2]_w$ $[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$; optionally, the second region comprises, a first portion of fourth composition adjacent said first region; a second portion of fifth composition; and a third portion of sixth composition separated from the first portion by the second portion and adjacent said third region wherein the fifth composition is different from the fourth and sixth compositions; optionally, the second portion comprises a first surface adjacent said first portion and a second surface adjacent said third portion and said fifth composition varies from the first surface to the second surface; optionally, the second portion comprises a first surface adjacent said first portion and a second surface adjacent said third portion and comprises a superlattice with a structure comprising two layers of different composition which repeat at least once; optionally, the first portion is in a first state of stress and said third portion is in a second state of stress different than the first state of stress.

In some embodiments a solid state device comprising at least two solar cells in tandem comprises a first solar cell of first composition, a second solar cell of second composition and a third region of third composition separating the first solar cell from the second solar cell; wherein the third region comprises a first and second rare-earth and the first composition is different from the second composition; optionally, a solid state device has first and second compositions of elements substantially from Group IV; optionally, a solid state device has a second composition comprising elements substantially from Groups III and V; optionally, a solid state device has a second composition comprising elements substantially from Groups II and VI; optionally a solid state device has a composition of said third region described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < w, x, y \leq 5$; optionally, a solid state device has a third region comprising a first portion of fourth composition adjacent said first solar cell, a second portion of fifth composition and a third portion of sixth composition separated from the first portion by the second portion and adjacent said second solar cell wherein the fifth composition is different from the fourth and sixth compositions; optionally, a solid state device has a second portion comprising a first surface adjacent said first portion and a second surface adjacent said third portion and said fifth composition varies from the first surface to the second surface; optionally, a solid state device has a second portion comprising a first surface adjacent said first portion and a second surface adjacent said third portion and comprises a superlattice with a structure comprising two layers of different composition which repeat at least once; optionally, a solid state device has a first portion in a first state of stress and said third portion is in a second state of stress different than the first state of stress; optionally, a solid state device has a third region comprising a first portion adjacent said first solar cell and a second portion adjacent said second solar cell such that the first portion is in a first state of stress and the second portion is in a second state of stress different from the first state of stress.

In some embodiments a solid state device for converting incident radiation to electrical energy comprises a first and second semiconductor layers operable as tandem photovoltaic cells separated by a rare earth layer wherein the first semiconductor layer is of composition $X_{(1-m)}Y_m$; the second semiconductor layer is of composition $X_{(1-n)}Y_n$ and the rare earth layer is of a composition described by $[RE1]_v[RE2]_w[RE3]_x[J1]_y[J2]_z$ wherein [RE] is chosen from a rare earth; [J1] and [J2] are chosen from a group consisting of oxygen (O), nitrogen (N), and phosphorus (P), and X and Y are chosen from Group IV elements such that $0 \leq n, m \leq 1, 0 \leq v, w, z \leq 5$, and $0 < x, y \leq 5$ and wherein n is different from m; optionally, a solid state device, for a least a portion of said rare earth layer, has a composition described by $0 \leq w, z \leq 5$ and $0 < v, x, y \leq 5$; optionally, a solid state device has a first semiconductor layer comprising an initial layer and a secondary layer such that the composition of the initial layer is described by $X_{(1-a)}Y_a$ and the composition of the secondary layer is described by $X_{(1-b)}Y_b$ and a is different from b; wherein X and Y are chosen from Group IV elements; optionally, a solid state device has a second semiconductor layer comprising an initial layer and a secondary layer such that the composition of the initial layer is described by $X_{(1-c)}Y_c$ and the composition of the secondary layer is described by $X_{(1-d)}Y_d$ and c is different from d; wherein X and Y are chosen from Group IV elements.

In some embodiments a solid state device for converting incident radiation to electrical energy comprises a first semiconductor layer operable as a photovoltaic cell, a second semiconductor layer operable as a photovoltaic cell and a rare earth layer comprising regions of different rare earth compositions separating the first semiconductor layer from the second semiconductor layer; wherein the rare earth layer is of a composition described by $[RE1]_v[RE2]_w[RE3]_x[J1]_y[J2]_z$ wherein [RE] is chosen from a rare earth; [J1] and [J2] are chosen from a group consisting of oxygen (O), nitrogen (N), and phosphorus (P), such that $0 \leq v, w, z \leq 5$, and $0 < x, y \leq 5$ such that the composition of the rare earth layer adjacent the first semiconductor layer is different than the composition of the rare earth layer adjacent the second semiconductor layer; optionally, a solid state device has first and second semiconductor materials chosen substantially from a group consisting of Group IV elements, Group III-V elements and Group II-VI elements; optionally, a solid state device has a rare earth layer comprising a superlattice of a structure that repeats at least once; optionally a solid state device has a rare earth layer comprising a first portion with a first composition described by $[RE1]_v[RE2]_w[J1]_y$ wherein [RE] is chosen from a rare earth; [J1] is chosen from a group consisting of oxygen (O), nitrogen (N), and phosphorus (P), such that $0 \leq w \leq 5$, and $0 < v, y \leq 5$ and a second portion with a second composition described by $[RE1]_a[RE2]_b[RE3]_c[J1]_d[J2]_e$ wherein [RE] is chosen from a rare earth; [J1] and [J2] are chosen from a group consisting of oxygen (O), nitrogen (N), and phosphorus (P), such that $0 \leq c, e \leq 1, 0 < b, c, d \leq 5$, and wherein the first composition is different from the second composition.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by Claims following. All patents, patent applications, and other documents referenced herein are incorporated by reference in their entirety for all purposes, unless otherwise indicated.

We claim:

1. A solid state device comprising at least two solar cells in tandem comprising;

a first solar cell of first composition comprising first and second surfaces;

a second solar cell of second composition comprising first and second surfaces; and a third region of third composition comprising first and second surfaces separating the first solar cell from the second solar cell;

wherein the third region consists of first and second rare-earth oxide compounds and wherein the first and second compositions consist of elements substantially from Group IV and the first composition is different from the second composition and the first surface of the third region is in contact with substantially all of the second surface of the first solar cell and the second surface of the third region is in contact with substantially all of the first surface of the second solar cell and wherein the composition of the third region consists substantially of $[RE1]_v$, $[RE2]_w[RE3]_x[J1]_y[J2]_z$ wherein [RE] is chosen from a rare earth; [J1] is oxygen and [J2] is chosen from a group consisting of Oxygen (O), Nitrogen (N), and Phosphorus (P), and $0 \leq v, z \leq 5$, and $0 < w, x, y \leq 5$.

2. A solid state device of claim 1 wherein said composition of said third region consists of one or more compounds described by $[RE1]_v[RE2]_w[RE3]_x[J1]_y[J2]_z$ wherein [RE] is chosen from a rare earth; [J1] is oxygen and [J2] is chosen from a group consisting of Oxygen (O), Nitrogen (N), and Phosphorus (P), and $0 \leq v, z \leq 5$, and $0 < w, x, y \leq 5$.

3. A solid state device of claim 1 wherein said third region comprises;
a first portion of fourth composition adjacent said first solar cell;
a second portion of fifth composition; and
a third portion of sixth composition separated from the first portion by the second portion and adjacent said second solar cell wherein the fifth composition is different from the fourth and sixth compositions.

4. A solid state device of claim 3 wherein said second portion comprises a first surface adjacent said first portion and a second surface adjacent said third portion and said fifth composition varies from the first surface to the second surface.

5. A solid state device of claim 3 wherein said second portion comprises a first surface adjacent said first portion and a second surface adjacent said third portion and comprises a superlattice with a structure comprising two layers of different composition which repeat at least once.

6. A solid state device of claim 3 wherein said first portion is in a first state of stress and said third portion is in a second state of stress different than the first state of stress.

7. A solid state device of claim 1 wherein said third region comprises a first portion adjacent said first solar cell and a second portion adjacent said second solar cell such that the first portion is in a first state of stress and the second portion is in a second state of stress different from the first state of stress.

8. A solid state device for converting incident radiation to electrical energy comprising;
first and second semiconductor layers operable as tandem photovoltaic cells separated by a rare earth layer wherein the first semiconductor layer is of composition $X_{(1-m)}$ $Y_m$; the second semiconductor layer is of composition $X_{(1-n)}Y_n$ and the rare earth layer consists of one or more compositions described by $[RE1]_v[RE2]_w[RE3]_x[J1]_y$ $[J2]_z$ wherein [RE] is chosen from a rare earth; [J1] is oxygen and [J2] is chosen from a group consisting of oxygen (O), nitrogen (N), and phosphorus (P), and X and Y are chosen from Group IV elements such that $0 \leq n, m \leq 1$, $0 \leq v, w, z \leq 5$, and $0 < x, y \leq 5$ and wherein n is different from m.

9. The device of claim 8 wherein $0 \leq w, z \leq 5$ and $0 < v, x, y \leq 5$ for a least a portion of said rare earth layer.

10. The solid state device of claim 8 wherein said first semiconductor layer comprises an initial layer and a secondary layer such that the composition of the initial layer is described by $X_{(1-a)}Y_a$ and the composition of the secondary layer is described by $X_{(1-b)}Y_b$ and a is different from b; wherein X and Y are chosen from Group IV elements.

11. The solid state device of claim 8 wherein said second semiconductor layer comprises an initial layer and a secondary layer such that the composition of the initial layer is described by $X_{(1-c)}Y_c$ and the composition of the secondary layer is described by $X_{(1-d)}Y_d$ and c is different from d; wherein X and Y are chosen from Group IV elements.

12. A solid state device comprising at least two photovoltaic cells in tandem for converting incident radiation to electrical energy comprising;
first semiconductor layer operable as a photovoltaic cell;
second semiconductor layer operable as a photovoltaic cell; the first semiconductor layer and the second semiconductor layer being arranged in tandem; and
a rare earth layer comprising regions of different rare earth compositions separating the first semiconductor layer from the second semiconductor layer;
wherein the rare earth layer consists of compositions described by $[RE1]_v[RE2]_w[RE3]_x[J1]_y[J2]_z$ wherein [RE] is chosen from a rare earth; [J1] is oxygen and [J2] is chosen from a group consisting of oxygen (O), nitrogen (N), and phosphorus (P), such that $0 \leq v, w, z \leq 5$, and $0 < x, y \leq 5$ such that the composition of the rare earth layer adjacent the first semiconductor layer is different than the composition of the rare earth layer adjacent the second semiconductor layer.

13. The device of claim 12 wherein the first and second semiconductor materials are chosen substantially from a group consisting of Group IV elements.

14. The device of claim 12 wherein the rare earth layer comprises a superlattice of a structure that repeats at least once.

15. The device of claim 12 wherein said rare earth layer comprises a first portion with a first composition described by $[RE1]_v[RE2]_w[J1]_y$ wherein [RE] is chosen from a rare earth; [J1] is chosen from a group consisting of oxygen (O), nitrogen (N), and phosphorus (P), such that $0 \leq w \leq 5$, and $0 < v, y \leq 5$ and a second portion with a second composition described by $[RE1]_a[RE2]_b[RE3]_c[J1]_d[J2]_e$ wherein [RE] is chosen from a rare earth; [J1] and [J2] are chosen from a group consisting of oxygen (O), nitrogen (N), and phosphorus (P), such that $0 \leq a, e \leq 1$, $0 < b, c, d \leq 5$, and wherein the first composition is different from the second composition.

* * * * *